US005931630A

United States Patent [19]

Tsai

[11] Patent Number: 5,931,630

[45] Date of Patent: Aug. 3, 1999

[54] MATERIAL FEEDING APPARATUS FOR USE IN A SURFACE MOUNTING SYSTEM

[75] Inventor: Sammy Tsai, Taoyuan, Taiwan

[73] Assignee: Harmony Technology Corp., Taiwan

[21] Appl. No.: 09/012,982

[22] Filed: Jan. 26, 1998

[51] Int. Cl.[6] .................................................... B65G 65/34

[52] U.S. Cl. .......................... 414/416; 414/403; 414/415; 29/809; 209/909; 221/11; 221/200

[58] Field of Search .................................... 414/403, 404, 414/413, 415, 416, 418, 414, 627; 29/741, 751, 809; 324/158.1, 719; 209/573, 571, 909, 936; 221/11, 200, 186, 197, 264, 289

[56] References Cited

U.S. PATENT DOCUMENTS 4,724,965 2/1988 Willberg .............................. 414/404 X
4,760,924 8/1988 Sato et al. ........................... 414/403 X
4,763,811 8/1988 Mae et al. ........................... 414/403 X
4,775,279 10/1988 Linker ................................ 414/404 X
5,217,120 6/1993 Lee et al. ............................ 414/415 X
5,503,299 4/1996 Smith ................................. 414/415 X
5,702,224 12/1997 Kubota ............................... 414/416 X

FOREIGN PATENT DOCUMENTS 218430 9/1988 Japan .................................... 414/403

*Primary Examiner*—Frank E. Werner
*Attorney, Agent, or Firm*—Dougherty & Troxell

[57] ABSTRACT

A material feeding apparatus for supplying surface mounting elements for suction by a suction nozzle for surface mounting on PC boards, the apparatus including a first casing, a second casing connected in series to the first casing in an oblique position, first holder means which holds a delivery pipe on the first casing, second holder means which holds a stack of material pipes on the second casing, a material take-up unit mounted on the first casing and controlled to take out surface mounting elements from the delivery pipe for suction by the suction nozzle above, vibration motors controlled to vibrate the delivery pipe and the material pipes, enabling surface mounting elements to be shaken out of the material pipes into the delivery pipe in proper order and then shaken out of the delivery pipe to the material take-up unit, and an empty pipe return drive unit controlled to carry emptied material pipes away from the second casing.

5 Claims, 5 Drawing Sheets

7 9 7 7 9 42 56 32 6 13 31 3 313 83 8 86 332 33 4 41 41 41 41 411 53 22 411 431 432 431 433 43 311 31 312 332 331 33 222 221 11 411 41 412 54 1 57 431 431 55 412 21 2 12

86
85
84
83
313
3
8
31
312
82
81
11
32
13
222
14
1
21
33
331
56
42
23
12
4
54
52
411
41
51
5
21
53
2
23
411
41
57
55
433
432
431
43
431

86
85
84
313
83
3
8
31
81
312
11
82
6
32
1
13
222
221
14
33
56
331
42
23
54
12
52
411
51
41
21
5
53
2
23
411
41
7
55
57
433
432
431
43
431

MATERIAL FEEDING APPARATUS FOR USE IN A SURFACE MOUNTING SYSTEM

BACKGROUND OF THE INVENTION

The present invention relates to a material feeding apparatus for SMT (surface mounting technique), and more particularly to such a material feeding apparatus which automatically supplies surface mounting elements for example integrated circuit chips for suction by a suction nozzle for surface mounting on PC boards.

In a surface mounting system, surface mounting elements for example IC chips are fed by labor to a vibrating conveyer, and then delivered forwards by the vibrating conveyer for suction by a suction nozzle for surface mounting on PC boards. Because surface mounting elements are delivered forwards by the vibrating conveyer, delivered surface mounting elements may fall in all directions and cannot be accurately delivered to the suction position for easy suction by the suction nozzle.

SUMMARY OF THE INVENTION

The present invention has been accomplished to provide a material feeding apparatus for use in a surface mounting system which eliminates the aforesaid problem. It is one object of the present invention to provide a material feeding apparatus which feeds surface mounting elements at a constant speed in proper order. It is another object of the present invention to provide a material feeding apparatus which keeps surface mounting elements to be accurately delivered to the suction position for easy suction by the suction nozzle of the surface mounting system. It is still another object of the present invention to provide a material feeding apparatus which uses a stake of material pipes to carry surface mounting elements for automatic feeding, and automatically takes emptied material pipes out of the feeding position. According to one aspect of the present invention, the material feeding apparatus comprises a first casing, a second casing connected in series to the first casing in an oblique position, first holder means which holds a delivery pipe on the first casing, second holder means which holds a stack of material pipes on the second casing, a material take-up unit mounted on the first casing and controlled to take out surface mounting elements from the delivery pipe for suction by the suction nozzle above, vibration motors controlled to vibrate the delivery pipe and the material pipes, enabling surface mounting elements to be shaken out of the material pipes into the delivery pipe in proper order and then shaken out of the delivery pipe to the material take-up unit, and an empty pipe return drive unit controlled to carry emptied material pipes away from the second casing. According to another aspect of the present invention, the first holder means and second holder means can be adjusted subject to the size of the delivery pipe and the material pipes installed. According to still another aspect of the present invention, the first holder means has parallel rails with extension portions for guiding surface mounting elements from the delivery pipe to the suction position and keeping delivered surface mounting elements in good order.

DETAILED DESCRIPTION OF THE PREFERRED EMBODIMENT

Figure 1:
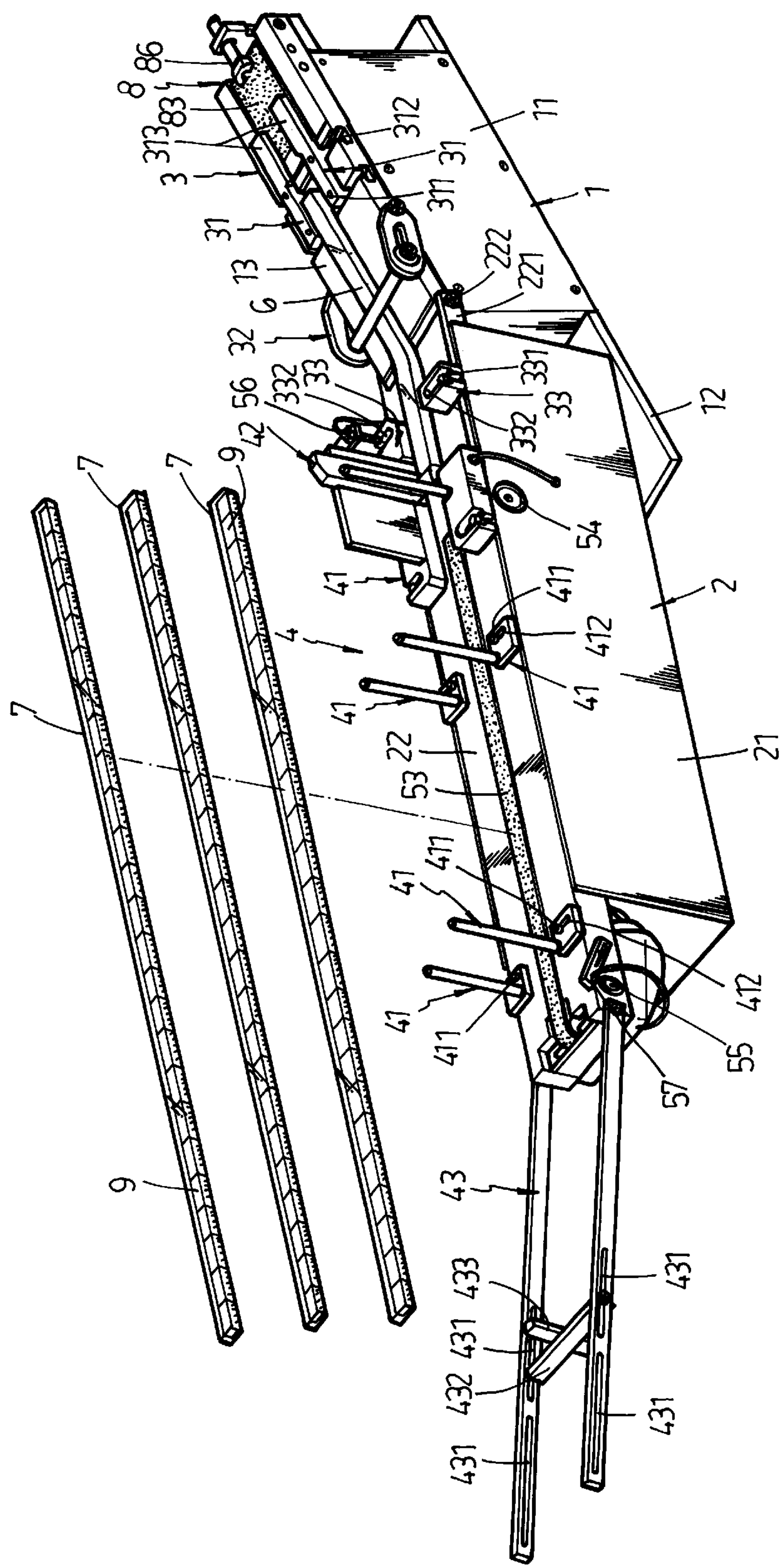
FIG. 1 is a perspective view of a material feeding apparatus for use in a surface mounting system according to the present invention.
Figure 2:
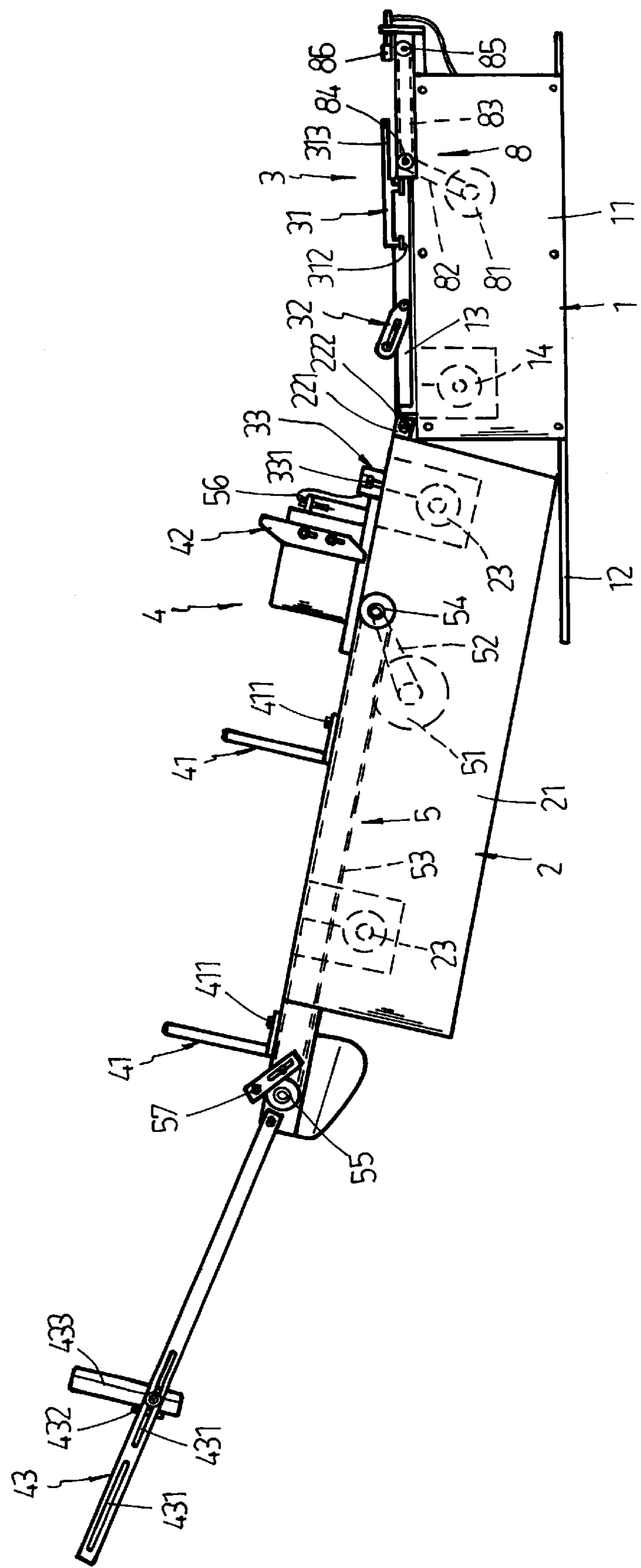
FIG. 2 is plain view of the material feeding apparatus shown in FIG. 1 before the loading of material pipes.

Referring to FIGS. from 1 to 3, the invention is generally comprised of a first casing 1, a second casing 2, a first pipe holder unit 3, a second pipe holder unit 4, an empty pipe return drive unit 5, a material take-up unit 8, a delivery pipe 6, and a plurality of material pipes 7. The material pipes 7 are filled up with surface mounting elements 9 before use. When in use, the material pipes 7 are carried on the second pipe support unit 4 in a stack. The delivery pipe 6 is mounted on the first casing 1 and the second casing 2 at the top and secured in place by the second pipe holder unit 3, having a rear end disposed in longitudinal alignment with the front end of the bottom material pipe 7 in the second pipe holder unit 4 and a front end in longitudinal alignment with the conveying belt 83 of the material take-up unit 8. The material take-up unit 8 is mounted on the first casing 1 at the top at the front side in front of the delivery pipe 6, and controlled to carry surface mounting elements 9 from the delivery pipe 6 to the front side for suction by a vacuum suction nozzle for further surface mounting on a PC board.

The first casing 1 is comprised of a substantially rectangular hollow frame 11, a bottom extension plate 12 longitudinally backwardly extended from the bottom side of the hollow frame 11, a top plate 13 covered on the top side of the hollow frame 11, and a vibration motor 14 mounted inside the hollow frame 11 near the rear side and controlled to vibrate the top plate 13 relative to the hollow frame 11.

The second casing 2 is comprised of a substantially rectangular hollow frame 21, a top plate 22 covered on the hollow frame 21, and two vibration motors 23 mounted inside the hollow frame 21 and respectively disposed at the front side and the rear side. The vibration motors 23 are controlled to vibrate the top plate 22 of the second casing 2. The top plate 22 has a front projecting portion 221 pivoted to the rear side of thc first casing 1 by a pivot 222. The front end of the bottom side of the second casing 2 is supported on the bottom extension plate 12 of the first casing 1. When installed, the second casing 2 slopes upwardly backwards from the first casing 1.

The first pipe holder unit 3 comprises two parallel sliding grooves 312 transversely made on the top plate 13 of the first casing 1 at the top, two parallel rails 31 longitudinally arranged on the top plate 13 of the first casing 1 and transversely moved relative to each other along the parallel sliding grooves 312, a plurality of tightening up screws 311 respectively mounted in a respective screw hole on the parallel rails 31 and screwed tight to fix the parallel rails 31 to the top plate 13 subject to the desired pitch between the parallel rails 31, enabling the front end of the delivery pipe 6 to be retained firmly in between the parallel rails 31, a substantially U-shaped clamp 32 pivoted to the top plate 13 of the first casing 1 and releasably controlled to hold down the delivery pipe 6, and two locating blocks 33 bilaterally and transversely slidably mounted on the top plate 22 of the second casing 2 and fixed in place to secured the rear end of the delivery pipe 6. The parallel rails 31 have a respective front extension 313 forwardly extending along two sides of the conveying belt 83 of the material take-up device 8 for guiding surface mounting elements 9 to the conveying belt 83. Each locating block 33 has a transversely extended oblong slot 332, and a lock screw 332 inserted through the oblong slot 332 and threaded into a screw hole on the top plate 22 of the second casing 2. When the lock screw 332 is loosened, the respective locating block 33 can then be moved transversely on the top plate 22 to the desired location and then fixed at the desired locating by fastening up the respective lock screw 332 again.

The second pipe holder unit 4 comprises pairs of locating blocks 41 bilaterally and transversely slidably mounted on the top plate 22 of the second casing 2 and fixed in place to secured the loaded stack of material pipes 7 in alignment with the delivery pipe 6, a stop plate 42 vertically slidably mounted one locating block 41 and fixed at the desired elevation by for example a tightening up screw to stop the front end of the stack of the loaded material pipes 7, permitting the bottom material pipe 7 to pass over the bottom side of the stop plate 42 and to be connected to the rear end of the delivery pipe 6, two parallel oscillating bars 43 bilaterally pivoted to the rear side of the top plate 22 of the second casing 2 and having a respective longitudinal sliding slot 431 near the rear end, a transverse connecting plate 432 coupled between the parallel oscillating bars 43 and slidably moved along the longitudinal sliding slots 431 on the parallel oscillating bars 43 and releasably fixed in place by screw means, and a vertical stop plate 433 fixedly fastened to the transverse connecting plate 432 on the middle for stopping the rear end of the stack of the loaded material pipes 7. Each locating block 41 has a transversely extended oblong slot 412, and a lock screw 411 inserted through the oblong slot 412 and threaded into a screw hole on the top plate 22 of the second casing 2. When the lock screw 411 is loosened, the respective locating block 41 can then be moved transversely on the top plate 22 to the desired location and then fixed at the desired locating by fastening up the respective lock screw 311 again.

The empty pipe return drive unit 5 is comprised of a motor 51, a front wheel 54, a rear wheel 55, a transmission belt 52 coupled between the motor 51 and the front wheel 54, a conveying belt 53 coupled between the front wheel 54 and the rear wheel 55, a first sensor 56, and a second sensor 57. The motor 51 is mounted inside the hollow frame 21 of the second casing 2. When the surface mounting elements 9 are completely carried out of one material pipe 7, the empty condition of the emptied material pipe 7 is immediately detected by the first sensor 56, and the first sensor 56 immediately gives a signal to the motor 51, causing the motor 51 to be turned on. When the motor 51 is started, the transmission belt 52 is driven to rotate the front wheel 54, causing the conveying belt 53 to be turned and circulated over the top side of the top plate 22 of the second casing 2, so as to carry the emptied material pipe 7 backwardly out of the top plate 22 of the casing 2.

Figure 4:
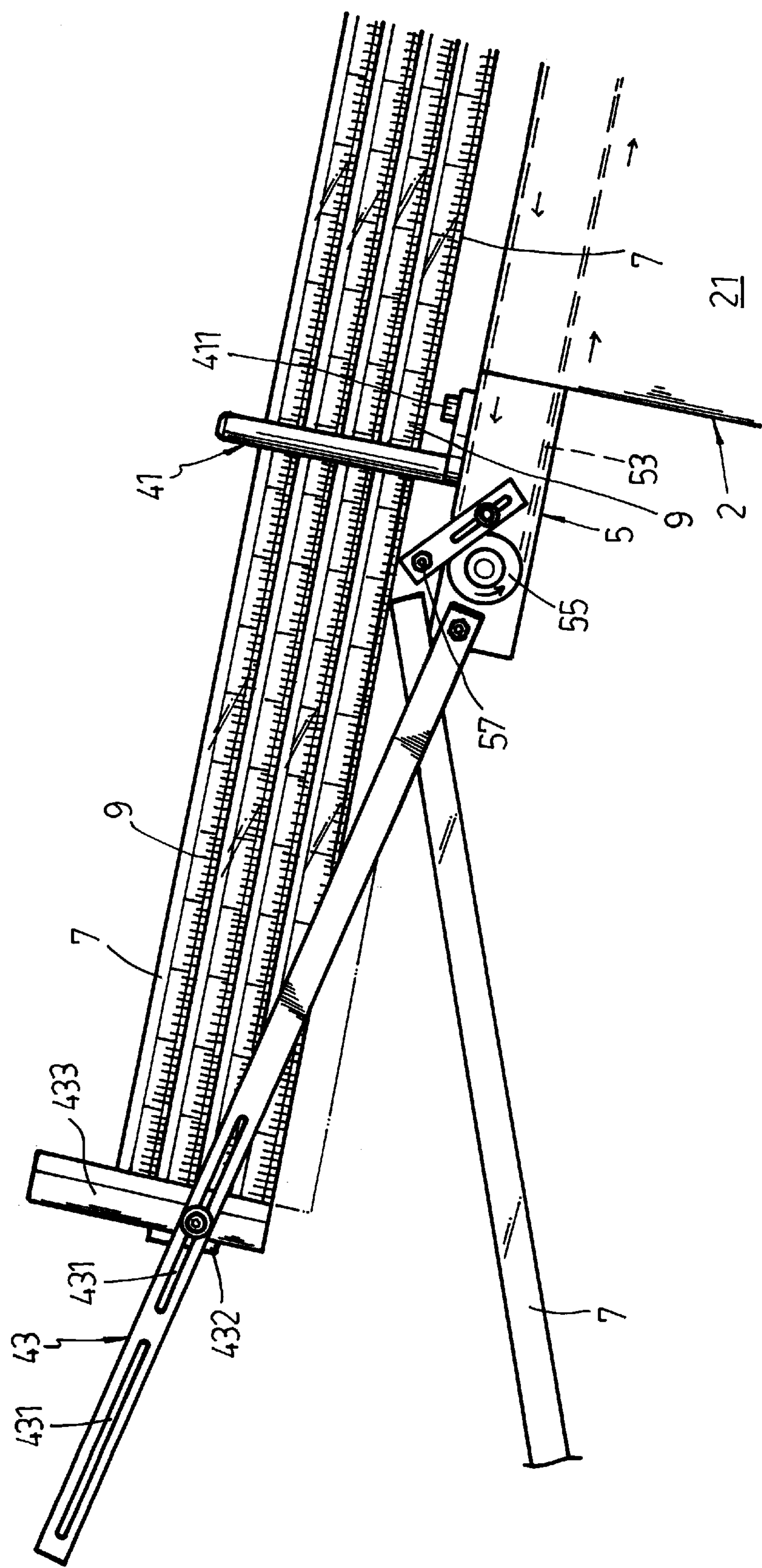
FIG. 4 is an enlarged view of the rear part of the present invention, showing the empty pipe return drive unit operated.

Referring to FIG. 4, when one empty material pipe 7 is moved out of the top plate 22 of the casing 2 and the it is immediately detected by the second sensor 57, and the second sensor 57 immediately gives a signal to cut off power supply from the motor 51. After the emptied material pipe 7 has been carried out of the top plate 22 of the casing 2, the material pipe above is lowered, and surface mounting elements are continuously provided.

Figure 3:
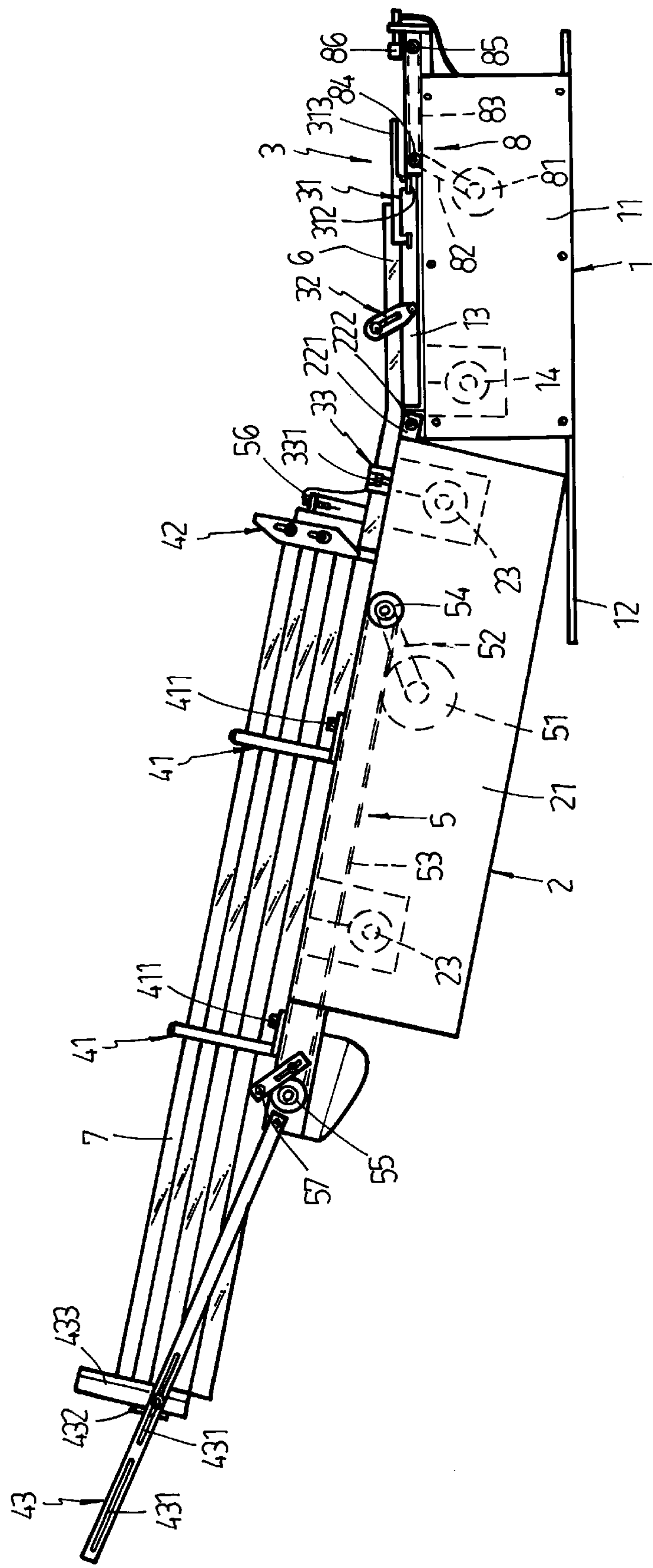
FIG. 3 is similar to FIG. 2 but showing material pipes loaded.
Figure 5:
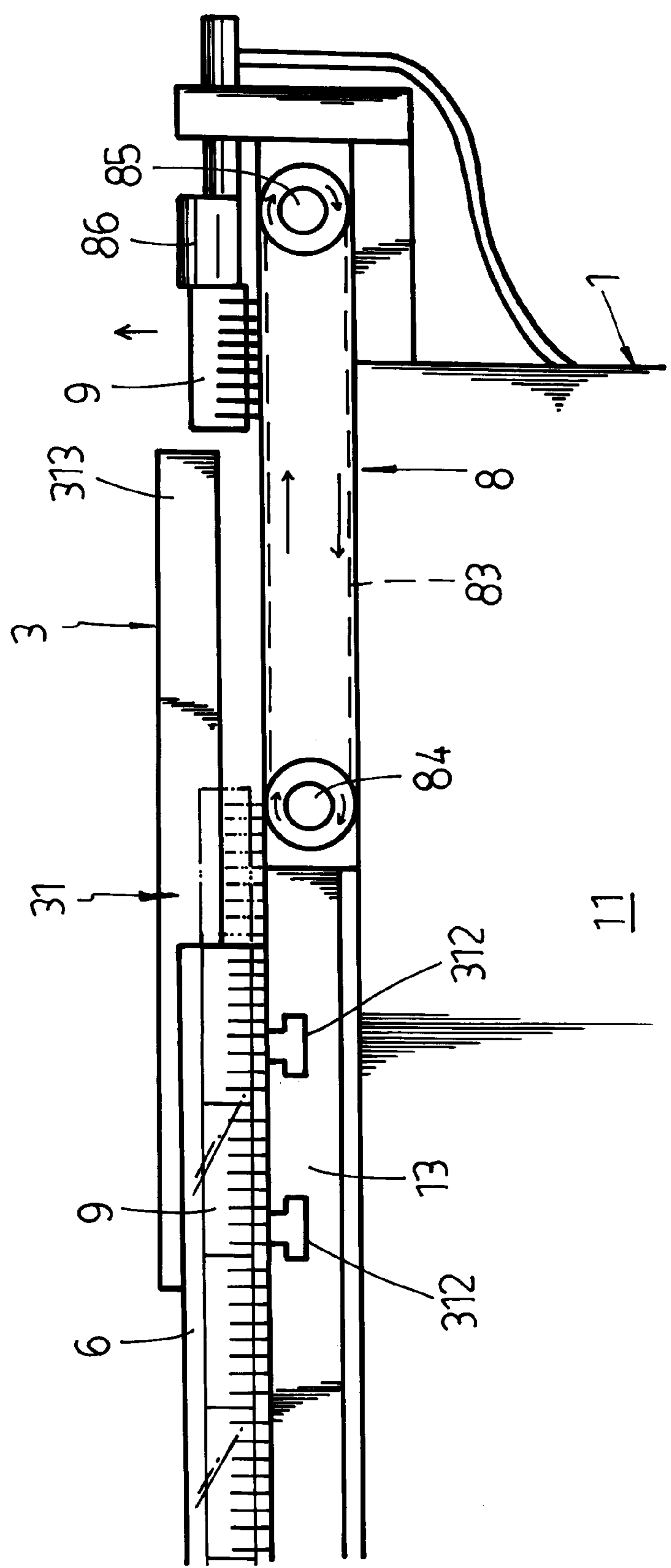
FIG. 5 is an enlarged view of the front part of the present invention, showing the material take-out unit operated.

Referring to FIG. 5 and FIG. 3 again, material take-up unit 8 is comprised of a motor 81, a transmission belt 82, a conveying belt 83, a rear wheel 84, a front wheel 85, and a micro switch and stop member assembly 86. When the motor 81 is started, the transmission belt 82 is driven to rotate the rear wheel 84, thereby causing the conveying belt 83 to circulate. The micro switch and stop member assembly 86 is mounted in front of the conveying belt 83. When a surface mounting element 9 is delivered to the micro switch and stop member assembly 86, it is stopped in place for suction by the suction nozzle, and the micro switch of the micro switch and stop member assembly 86 is simultaneously triggered to cut off power supply from the motor 81. When the stopped surface mounting element is taken away from the micro switch and stop member assembly 86, the micro switch of the micro switch and stop member assembly 86 immediately turns on the motor 81. The revolving speed of the conveying belt 83 is adjustable. During operation, the vibration motors 14;23 are operated to vibrate the top plate 13 of the first casing 1 and the top plate 22 of the second casing 2, causing surface mounting elements 9 to be shaken out of the bottom material pipe 7 and forced forwards through the delivery pipe 6 to the conveying belt 83 of the material take-up unit 8.

While only one embodiment of the present invention has been shown and described, it will be understood that various modifications and changes could be made thereunto without departing from the spirit and scope of the invention disclosed.

What the invention claimed is:

1. A material feeding apparatus comprising:

a first casing, said first casing comprising a substantially rectangular hollow frame, a bottom extension plate and a top plate at top and bottom sides of the hollow frame thereof, a vibration motor controlled to vibrate the top plate of said first casing, the top plate of said first casing having a front side and a rear side;

a second casing connected in series to said first casing and sloping upwardly backwards from said first casing, said second casing comprising a top plate and at least one vibration motor controlled to vibrate the top plate of said second casing;

a plurality of material pipes arranged in a stack and loaded on the top plate of said second casing, said material pipes carrying therein a plurality of surface mounting elements for surface mounting;

a delivery pipe mounted on the top plate of said first casing and the top plate of said second casing for guiding surface mounting elements out of said material pipes, said delivery pipe having a front end and a rear end;

a first pipe holder unit for securing said delivery pipe in place, said first pipe holder unit comprising two parallel rails longitudinally arranged on the top plate of said first casing to hold the front end of said delivery pipe therebetween, a substantially U-shaped clamp pivoted to the top plate of said first casing to hold down said delivery pipe on the top plate of said first casing, and two locating blocks bilaterally mounted on the top plate of said second casing to hold the rear end of said delivery pipe therebetween;

a second pipe holder unit for securing said material pipes in place, said second pipe holder unit comprising pairs of locating blocks bilaterally mounted on the top plate of said second casing to hold said material pipes in therebetween in a stack, a stop plate mounted on one locating block of said second pipe holder adjacent to said first casing to stop loaded material pipes from moving forwards to said first casing, for permitting the bottom material pipe to be moved forwards and stopped at the rear end of said delivery pipe so that carried surface mounting elements can be shaken out of the bottom material pipe into said delivery pipe and then shaken out of the front end of said delivery pipe, an oscillating frame bar assembly pivoted to said second casing remote from said first casing to hold said material pipes on the top plate of said second casing;

an empty pipe return drive unit mounted in said second casing and controlled to carry emptied material pipes away from the top plate of said second casing, said empty pipe return drive unit comprising a motor, a conveying belt mounted on the top plate of said second casing and turned to deliver emptied material pipes out of the top plate of said second casing, a belt transmission mechanism coupled between the motor and conveying belt of said empty pipe return drive unit, and sensor means mounted on said second casing to detect the presence of an emptied material pipe and to control the operation of the motor of said empty pipe return drive unit subject to the detection result; and a material take-up unit mounted on said first casing and controlled to take out surface mounting elements from said delivery pipe, said material take-up unit comprising a motor, a conveying belt coupled to the motor of said material take-up unit and turned to deliver surface mounting elements from said delivery pipe to the front side of the top plate of said first casing, and a micro switch and stop member assembly mounted on the front side of the top plate of said first casing and adapted to stop surface mounting elements for permitting surface mounting elements to be picked up by a suction nozzle above, said micro switch and stop member assembly having a micro switch, said micro switch being driven to turn on the motor of said material take-out unit when a surface mounting element is stopped at said micro switch and stop member assembly, or to turn off the motor of said material take-out unit when no surface mounting element is stopped at said micro switch and stop member assembly.

2. The material feeding apparatus of claim 1, wherein the top plate of said second casing has a front extension portion pivoted to the rear end of the top plate of said first casing, permitting a hollow frame of said second casing to be supported on the bottom extension plate of said first casing in an oblique position.

3. The material feeding apparatus of claim 1, wherein said parallel rails are moved relative to each other along transverse sliding grooves on the top plate of said first casing and then fixed in place by screw means carried on said rails.

4. The material feeding apparatus of claim 1, wherein said parallel rails have a respective front extension extended forwards along two sides of the conveying belt of said material take-up unit.

5. The material feeding system of claim 1, wherein said oscillating frame bar assembly comprises two parallel oscillating bars bilaterally pivoted to the top plate of said second casing, said oscillating bars having a respective longitudinal sliding slot remote from said second casing, a transverse connecting plate coupled between said parallel oscillating bars and slidably moved along the longitudinal sliding slots on said parallel oscillating bars and fixed in place by screw means, and a vertical stop plate fixedly fastened to said transverse connecting plate on the middle for stopping at said material pipes at one end remote from the stop plate of said second pipe holder unit.

* * * * *